United States Patent
Birnbach

(10) Patent No.: US 10,791,656 B1
(45) Date of Patent: Sep. 29, 2020

(54) METHOD AND DEVICE FOR SEPARATING HIGH LEVEL ELECTROMAGNETIC DISTURBANCES FROM MICROWAVE SIGNALS

(71) Applicant: Advanced Fusion Systems LLC, Newtown, CT (US)

(72) Inventor: Curtis A. Birnbach, New Rochelle, NY (US)

(73) Assignee: ADVANCED FUSION SYSTEMS LLC, Newtown, CT (US)

( * ) Notice: Subject to any disclaimer, the term of this patent is extended or adjusted under 35 U.S.C. 154(b) by 0 days.

(21) Appl. No.: 16/671,883

(22) Filed: Nov. 1, 2019

(51) Int. Cl.
  *H05K 9/00* (2006.01)
  *H04B 1/04* (2006.01)
  *H01L 23/552* (2006.01)
  *H03H 7/01* (2006.01)

(52) U.S. Cl.
  CPC ......... *H05K 9/0007* (2013.01); *H01L 23/552* (2013.01); *H03H 7/0153* (2013.01); *H04B 1/0475* (2013.01); *H05K 9/0088* (2013.01)

(58) Field of Classification Search
  CPC .. H05K 9/0007; H05K 9/0088; H01L 23/552; H03H 7/0153; H04B 1/0475
  See application file for complete search history.

(56) References Cited

U.S. PATENT DOCUMENTS

| | | | | |
|---|---|---|---|---|
| 4,071,876 A * | 1/1978 | Benson | ...................... | H01T 4/06 361/119 |
| 4,112,418 A * | 9/1978 | Ishikawa | ................. | G01R 19/15 340/659 |
| 4,136,319 A * | 1/1979 | Bourde | ..................... | H04B 3/56 333/1 |
| 4,362,898 A * | 12/1982 | Zendle | ..................... | H01R 9/05 174/360 |
| 4,409,637 A * | 10/1983 | Block | .................... | H01Q 21/50 333/23 |
| 4,542,358 A * | 9/1985 | Boby | .................... | H01P 1/2039 333/12 |
| 4,554,608 A * | 11/1985 | Block | ...................... | H01Q 1/50 333/23 |
| 4,698,721 A * | 10/1987 | Warren | .................. | H02H 9/005 361/110 |
| 4,751,479 A * | 6/1988 | Parr | ...................... | H03H 1/0007 333/12 |
| 4,807,081 A * | 2/1989 | Crofts | .................... | H02H 9/048 361/111 |
| 4,841,259 A * | 6/1989 | Mayer | .................... | H01B 11/12 333/17.2 |
| 4,887,180 A * | 12/1989 | Climent | ................... | H02H 9/06 361/113 |

(Continued)

*Primary Examiner* — Jinsong Hu
*Assistant Examiner* — Rui M Hu
(74) *Attorney, Agent, or Firm* — Leason Ellis LLP

(57) ABSTRACT

A method of protecting an RF system from destructive effects of hazardous electromagnetic interference (EMI) comprises separating incoming electromagnetic radiation including hazardous electromagnetic interference according to frequency into low frequency spectral components below a selectable cutoff frequency and high frequency spectral components above the selectable cutoff frequency, and routing the low frequency portion of spectral components which include a vast majority of energy contained in the hazardous electromagnetic interference to ground via a low impedance conductor.

13 Claims, 9 Drawing Sheets

(56) References Cited

U.S. PATENT DOCUMENTS

| | | | | |
|---|---|---|---|---|
| 4,918,591 A * | 4/1990 | Link | H03H 7/06 | 333/167 |
| 5,124,873 A * | 6/1992 | Wheeler | H02H 9/06 | 361/111 |
| 5,390,337 A * | 2/1995 | Jelinek | H03H 7/461 | 725/128 |
| 5,896,265 A * | 4/1999 | Glaser | H01Q 1/50 | 361/111 |
| 5,966,283 A | 10/1999 | Glaser et al. | | |
| 5,978,199 A * | 11/1999 | Germann | H01P 1/202 | 333/207 |
| 6,018,448 A * | 1/2000 | Anthony | H01G 4/012 | 257/E23.079 |
| 6,028,549 A * | 2/2000 | Buckreuss | G01S 7/36 | 162/196 |
| 6,401,805 B1 * | 6/2002 | Wang | H01L 23/427 | 165/134.1 |
| 7,315,459 B2 * | 1/2008 | Schaffer | H01L 23/3677 | 257/E23.105 |
| 7,899,415 B1 * | 3/2011 | Schoneman | H04B 15/005 | 455/114.2 |
| 8,369,053 B2 * | 2/2013 | Moronval | H01L 27/0248 | 361/111 |
| 8,441,795 B2 * | 5/2013 | Jones | H01T 4/08 | 333/185 |
| 8,599,528 B2 * | 12/2013 | Bartel | H01P 1/203 | 361/118 |
| 8,730,640 B2 * | 5/2014 | Penwell | H01P 1/20 | 361/119 |
| 8,976,500 B2 * | 3/2015 | Penwell | H01R 24/48 | 307/90 |
| 2001/0038329 A1 * | 11/2001 | Diamanti | H04B 3/56 | 725/79 |
| 2003/0161086 A1 * | 8/2003 | Anthony | H01C 7/123 | 361/112 |
| 2003/0192715 A1 | 10/2003 | Lambert et al. | | |
| 2004/0108486 A1 * | 6/2004 | Yoshida | H05K 9/0083 | 252/62.54 |
| 2004/0145849 A1 * | 7/2004 | Chang | H01Q 21/50 | 361/120 |
| 2005/0099212 A1 * | 5/2005 | Ferianz | H03F 1/34 | 327/112 |
| 2005/0180091 A1 * | 8/2005 | Hayworth | H01G 4/35 | 361/306.3 |
| 2005/0236673 A1 | 10/2005 | Woo et al. | | |
| 2006/0098374 A1 * | 5/2006 | Youn | G06K 19/0701 | 361/119 |
| 2008/0025682 A1 | 1/2008 | Barnes | | |
| 2008/0204128 A1 * | 8/2008 | Brenner | H04B 15/005 | 327/552 |
| 2009/0251840 A1 * | 10/2009 | Alkan | H01P 1/202 | 361/119 |
| 2011/0007444 A1 * | 1/2011 | Chang | H04B 3/56 | 361/111 |
| 2011/0128660 A1 * | 6/2011 | Kauffman | H01P 1/20 | 361/118 |
| 2011/0292557 A1 * | 12/2011 | Penwell | H01R 24/48 | 361/118 |
| 2018/0010583 A1 * | 1/2018 | Andersen | H01R 4/66 | |

* cited by examiner

METHOD AND DEVICE FOR SEPARATING HIGH LEVEL ELECTROMAGNETIC DISTURBANCES FROM MICROWAVE SIGNALS

TECHNICAL FIELD

The present disclosure relates to a method and device for separating out low frequency components of electromagnetic interference (EMI) from an RF transmission system, particularly hazardous EMI including, but not limited to Electromagnetic Pulses (EMP) produced by nuclear detonations, coronal mass ejections, lightning or other sources.

Definitions

Electromagnetic Interference (EMI): electromagnetic radiation the reception of which is undesired in an electrical system as it can interfere with conveyed signals or equipment coupled to such system. EMI is defined herein as a broad term that encompasses numerous sub-types that are defined herein below.

Radio Frequency (RF): electromagnetic emissions and signals in the radio portion of the spectrum, ranging from a few KiloHertz to many TeraHertz.

Hazardous EMI: electromagnetic interference the receipt of which in an electrical system has a high likelihood of damaging or rendering inoperable electric equipment coupled to such system, such as, but not limited to, electrical generating equipment, electronic circuit boards and transformers. This interference may be a pulse or continuous emission.

Intentional electromagnetic interference (IEMI): electromagnetic interference intentionally (artificially) created to negatively affect a targeted electrical system. This interference may be a pulse or continuous emission.

Electromagnetic Attack: A scenario wherein a hazardous EMI signal is inflicted on some electrical or electronic equipment or systems with the intent to cause damage, disruption, or confusion of said system.

Electromagnetic Threat: A circumstance wherein a hazardous and intentional electromagnetic signal may be used against electrical or electronic equipment or systems with the intent to cause damage, disruption, or confusion of said system.

Nuclear electromagnetic interference (NEMI): electrical interference created by detonation of a nuclear device, and having an initial risetime of less than 3 nanoseconds. NEMI includes fast rise-time electromagnetic pulses (defined below) and radiation delivered with slower rise time and longer duration.

Electromagnetic Pulse (EMP): A transient burst of electromagnetic radiation having a fast rise time of typically less than 5 nanoseconds that is hazardous and can produce potentially damaging current and voltage surges (and can thus be considered a subset of hazardous EMI). Typical EMP intensity is in the order of tens of thousands of Volts/Meter. EMP can be produced by a nuclear detonation (NEMP; risetime typically is less than 5 nanoseconds) or by non-nuclear sources that produce a suddenly fluctuating electromagnetic field such as lightning and coronal mass ejections (NNEMP; risetime typically is less than 5 nanoseconds).

Extraordinary Electromagnetic Pulses: a class of EMP which encompasses all the various electromagnetic threats described herein. Extraordinary EMP includes transient pulses arising from nuclear explosions (NEMP), non-nuclear electromagnetic pulses (NNEMP) of sufficient strength to reach and render inoperative components of an electrical power system, or geomagnetically-induced current (GIC) as a result of coronal mass ejections from solar storms.

Source Region Electromagnetic Pulse (SREMP): A subset of Nuclear Electromagnetic Pulse (NEMP). A SREMP is produced by low-altitude (endo-atmospheric) nuclear burst. An effective net vertical electron current is formed by the asymmetric deposition of electrons in the atmosphere and the ground, and the formation and decay of this current emits a pulse of electromagnetic radiation in directions perpendicular to the current. The asymmetry from a low-altitude explosion occurs because some electrons emitted downward are trapped in the upper millimeter of the Earth's surface while others, moving upward and outward, can travel long distances in the atmosphere, producing ionization and charge separation. A weaker asymmetry can exist for higher altitude explosions due to the density gradient of the atmosphere.

High-altitude Electromagnetic Pulse (HEMP): Also a subset of NEMP. HEMP is produced when a nuclear weapon is detonated high above the Earth's surface (exo-atmospheric), creating gamma-radiation that interacts with the atmosphere to create an intense electromagnetic energy field that is harmless to people as it radiates outward but which can overload circuitry with effects similar to, but causing damage much more swiftly than a lightning strike.

System Generated EMP (SGEMP): SGEMP is a special class of EMP signal that occurs as a result of energy reflecting within an equipment enclosure. It is usually associated with and found within missiles but can occur elsewhere. It is unique in that it is a secondary form of EMP emission.

It is noted that NEMP, HEMP, SREMP, SGEMP, and others are all electromagnetic pulses derived from the explosion of a nuclear device (fission, fusion, thermonuclear fusion) All are typified by extremely fast risetimes, typically less than 5 nanoseconds, and which can have risetimes in the sub-nanosecond range. All these EMP types, as well as the Non-Nuclear EMP class (NNEMP) produce pulses that are typified by an extremely broad RF Bandwidth, typically ranging from a few KiloHertz to several GigaHertz. It is further noted that the signal level at any individual frequency across this portion of the spectrum is not uniform, but the bulk of the energy is located below around 200 MegaHertz. These boundaries are not fixed and are determined by a number of parameters that exist at the moment of the creation of said pulse.

DESCRIPTION OF THE RELATED ART

It is well known the certain events can produce electromagnetic radiation that can be extremely destructive to electrical infrastructure. The term used herein for this broad category of electromagnetic radiation is "hazardous electromagnetic interference (EMI)." In light of concerns regarding the spread of nuclear weapons and similarly destructive technology, research has been conducted to study the effects of the powerful burst of hazardous EMI emitted by nuclear detonations (NEMI). Research has shown that nuclear detonations generate bursts of electromagnetic pulses (EMP) with extremely fast rise-times (on the order of less than 5 nanoseconds), followed by slower, longer-lasting portions of the signals. Typical EMP intensity is in the order of tens of thousands of Volts/Meter. This compares with the order of 200 Volts/Meter for nearby radars, 10 Volts/Meter for communication equipment, and 0.01 Volts/Meter for typical metropolitan area ambient. It is also noted that Federal Communication Commission (FCC) guidelines mandate a limit of 0.5 Volts/Meter for emissions of this sort. Some of the characteristics of EMP which result in a threat to electrical equipment are extremely fast risetime, extremely short pulse width, and field amplitude which gives rise to a signal with broad frequency spectrum. There are three basic mechanisms for EM coupling to a conducting structure: electrical induction, the basic mechanism for linear conductors; magnetic induction, the principal mechanism when the conducting structure forms a closed loop; and signal transfer through the earth. Devices which may be susceptible to functional damage due to electrical transients include active electronic devices, passive electronic components, semiconductor devices, squibs and pyrotechnic devices, meters, and power systems, cables, switching and distribution elements. Operational upset and damage can be expected in digital processing systems, memory units, guidance systems, and power distribution systems. Damage mechanisms include dielectric breakdown, thermal effects and interconnection, switching, transformer and generator failures.

The spectral and energy distributions of a nuclear EMP of any type depends on how high in the atmosphere that the detonation takes place. Detonations take occur 40 km or less above the earth's surface, termed endo-atmospheric detonations, produce Source Region Electromagnetic Pulses (SREMP), while detonations that occur 40 km or above the earth's surface, termed exo-atmospheric detonations, produce High Altitude electromagnetic pulses (HEMP). SREMP is generated by collisions between photons from gamma radiation and molecules of the atmosphere. These highly energetic photons eject electrons from the surrounding air molecules, producing ionized air molecules. This immense separation of charge creates an intense E-Field which can be as high as several 100,000 Volts/Meter and has a large associated H-Field which can be as high as 5000 Ampere-turns/Meter. FIG. 1A is a graph of an exemplary EMP waveform generated by an exemplary 100 KiloTon endo-atmospheric detonation over time. In FIG. 1A, the start of the waveform (E1) of the SREMP is an extremely powerful pulse that rises to a maximum which can be as high as 250 KV/Meter in approximately 1 nanosecond and falls to approximately 10 KV/Meter within 10 nanoseconds. In the scenario identified above, the electric field remains approximately constant at 10 KV/Meter in the second portion of the waveform (E2) which lasts from the 10 nanosecond mark to about 100 μs after the detonation. In the third portion of the waveform (E3) which begins at about 100 μs after the detonation, the electric field drops from 10 KV/Meter to about zero by the 1 millisecond mark. FIG. 1B is a graph of the relative energy of the SREMP waveform versus frequency. As shown, the frequency content of the SREMP waveform lies in a frequency range below 1 MHz, with the vast majority of the spectral content lying below 10 kHz. It is noted that the exact field strengths, pulse risetimes, and duration depend upon a combination of multiple factors including device geometry, device yield, height of explosion, and atmospheric conditions at the time of detonation.

In contrast, a HEMP is generated by gamma photons being absorbed by atmospheric molecules at altitudes from 20 to 40 Kilometers. This absorption causes electrons to be deflected by the earth's magnetic field into a spiral path about the field lines, causing them to radiate electromagnetic energy. FIG. 2A is a graph of an EMI waveform generated by an exemplary exo-atmospheric detonation over time. As shown, the waveform of the HEMP is drastically different from its SREMP counterpart. For devices in the 5 KiloTon to 1 MegaTon range, this electron radiated energy creates a large, diverse E-Field in the range of tens of KiloVolts/Meter and an associated H-Field in the range of 10 to 300 Ampere-turns/Meter. Parts of the HEMP waveform can be of longer duration that SREMP, possibly lasting several seconds. As noted above, durations of specific parts of the waveform depend on a number of factors including device geometry, device yield, height of explosion, and atmospheric conditions at the time of detonation. FIG. 2B is a schematic graph of the relative energy of the HEMP waveform versus frequency. As shown, about ninety percent of the energy is contained in the 100 KHz to 10 MHz range.

It should be noted that the majority of electromagnetic attack scenarios involve more than a single pulse being used in said attack. The consequence of this is that in order for a protective scheme to be viable, it must be able to withstand multiple sequential electromagnetic attacks, possibly in close succession in order for such a protective scheme to be considered as a viable means of protection. Some protective schemes are single shot or potentially single shot and thus are not truly suitable for protection service, in spite of their current widespread use.

As noted above, in addition to the hazardous EMI generated by nuclear donations (SREMP and HEMP), electrical and electronic equipment can be damaged by other events such as non-nuclear electromagnetic pulse, intentional electromagnetic bursts, coronal mass ejections (solar storms) and lightning storms. Certain measures have been devised to protect electrical systems from hazardous EMI. For example, conventional systems and devices for suppression of hazardous EMI such as EMP and lightning include, but are not limited to: electron tube protective devices, metal oxide varistor solid state devices, spark gaps, and inductors.

Electron Tube Protective Devices: The inventor of the present application has previously developed protective means utilizing high speed high power cold cathode field emission electron tubes as a preferred means for protecting electrical and electronic equipment from damage due to any of the aforementioned electromagnetic threats. Such protective cold cathode field emissions electron tubes are described in U.S. Pat. No. 8,300,378 "Method and apparatus for protecting power systems from extraordinary electromagnetic pulses" by Birnbach, which is incorporated by reference herein in its entirety for any purpose. Testing of this class of electron tube device has shown it to be suitable for protective service in repetitive pulse applications with pulse repetition rates to over 500 KiloHertz. However, electron tube devices tend to be large and are not necessarily well suited for convenient coupling to existing microwave infrastructure.

Metal Oxide Varistors (MOVs): MOVs are solid state devices which, in their resting state, exhibit very high impedance, typically of 10-100MΩ. When a voltage is applied across a MOV in excess of some predetermined threshold, the MOV changes its internal impedance to a very low impedance state. This allows the MOV to be used to shunt overvoltages around critical circuit components. The speed at which this change of impedance occurs is a function of the specific design and material content of said MOV. A significant limitation of MOV devices is that, since they are semiconductors, once a fault in the crystalline structure of the substrate occurs, the MOV cannot be repaired or self-healed. The foregoing type of fault is the predominant failure mode of MOVs. As a result, MOVs cannot be relied on to provide protection for more than one overvoltage event. MOVs are currently the primary surge suppression means used by the public utilities in spite of this limitation.

In addition, care needs to be taken in specifying a MOV because most MOVs do not have a sufficiently fast risetime (typically approximately 20 nanoseconds) to be useful in suppressing EMP from a nuclear explosion (NEMP), particularly the E1 portions of SREMP and fast-rise time portions of HEMP. Even MOVs having fast reaction times adapted for high rise times (approx. 2-5 nanoseconds risetime) are still too slow to be effective against all E1 pulses which typically have sub-nanosecond rise times. This speed differential allows a devastatingly large amount of energy to pass before the protective action occurs, resulting in failure of the protected device and frequently of the protective device (MOV) as well. Therefore, MOVs are generally not effective against NEMP.

There are some MOVs on the market which claim to be suitable for use protecting against pulses in excess of 5,000 Amperes, even though their connecting wires are less than 0.125 inches (⅛") in diameter. If the pulse were sufficiently short, less than one nanosecond in duration, the connecting wires might not evaporate, but in any real-world electromagnetic attack scenario, the wires would evaporate thus rendering the device useless. It should be obvious to the person of ordinary skill in the art that the use of such devices is inadequate to provide protection against real-world electromagnetic threats.

Spark Gaps: A Spark Gap is a form of a fast switch which is sometimes used for hazardous EMI protection. A spark gap is wired to shunt the overvoltage around sensitive components. A problem with spark gaps is getting them to trigger reliably at some predetermined voltage. A further problem is that once fired, the contact surfaces of the spark gap degrade, and subsequent firing events are usually not at the same voltage as when the spark gap is new. Spark gaps require very high maintenance and their use is generally restricted to laboratory pulse power experimentation. Another form of spark gap that is used exclusively by the electric power distribution and transmission industry is a set of curved rods, often referred to as "horns." While too slow in risetime for protection against fast-rise time EMP, horns have been shown to be a simple approach for lightning protection and are widely used. Their major disadvantage is that they are easily damaged and require frequent replacement.

Inductors: can suppress fast transient signals when wired in series with a circuit. The problem with the use of serially connected inductors as protective devices is that the electrical insulation requirements and the tolerance of the diameter of the conductor in the inductor, which relates to its ability to handle certain amounts of current without overheating, are very strict, and serial inductors alone are generally not capable of adequately suppressing hazardous EMI signals. The ability of an inductor to withstand multiple repeated pulses is a function of its design, specifically the insulation and thermal ratings. Inductors consume energy and are usually only used in sub-stations where surplus energy is readily available.

Therefore, a need remains for a method and device that can reliably and efficiently overcome the foregoing deficiencies and protect electronic equipment, particularly in microwave equipment operating at frequencies at or above 1.5 GHz (electrical components) from hazardous EMI.

SUMMARY OF THE DISCLOSURE

The present disclosure further provides a method of protecting an RF system from destructive effects of hazardous electromagnetic interference (EMI) that comprises separating incoming electromagnetic radiation including hazardous electromagnetic interference according to frequency into low frequency spectral components below a selectable cutoff frequency and high frequency spectral components above the selectable cutoff frequency, and routing the low frequency portion of spectral components which include a vast majority of energy contained in the hazardous electromagnetic interference to ground via a low impedance conductor.

In some embodiments, the method further comprises routing the high frequency spectral components of the hazardous EMI into an enclosure containing an ionizable gas, wherein high energy components of the hazardous EMI induces ionization of the ionization gas, reducing remaining energy of the high frequency spectral component below a destructive level.

In some embodiments, the separating is performed using a waveguide through which the high frequency spectral components above the cutoff frequency pass, the waveguide being filled with the ionizable gas. The selectable cutoff frequency is determined by transverse dimensions of the waveguide.

In some embodiments, the low frequency spectral components are routed to ground through a low impedance conductor in the form of a strap having a width and thickness, the width having a magnitude at least two times greater than a magnitude of the thickness.

In an alternative embodiment, the separating is performed using a low pass filter which passes the high frequency spectral components of the hazardous EMI above the cutoff frequency, and a high pass filter which passes the low frequency spectral components of the hazardous EMI below the cutoff frequency, the low pass filter having an output coupled to an external ground.

In certain implementations, the output of the low pass filter is coupled to external ground via a low impedance conductor in the form of a strap having a width and thickness, the width having a magnitude at least two times greater than a magnitude of the thickness.

The present disclosure further provides, in a preferred embodiment, a device for protecting an RF system from destructive effects of hazardous electromagnetic interference (EMI). The device comprises a waveguide having an input port and an output port, each of the input and output ports having an RF transparent window. The waveguide is filled with an ionizable gas, and has an intrinsic cutoff frequency determined by its dimensions. The device also comprises a means for attachment of a low-impedance conductor having a first end coupled to the waveguide and a second end coupled to an external ground. The waveguide is constructed to block spectral components of incoming hazardous EMI below the cutoff frequency and said spectral components below the cutoff frequency are routed to ground via the low-impedance conductor. Spectral components above the cutoff frequency having high energy induce ionization of the ionizable gas present in the waveguide.

In some embodiments, the low impedance grounding conductor preferably includes a copper strap having a longitudinal width and a thickness, the longitudinal width having a magnitude at least two times greater than a magnitude of the thickness. The grounding conductor is connected to a low impedance ground to dissipate unwanted energy from a hazardous EMI pulse into the ground.

In some embodiments, the device further comprises a plasma probe coupled to the waveguide and a detector coupled to the plasma probe configured to measure a level of ionization within the waveguide.

In certain implementations, the cutoff frequency of the waveguide is approximately 500 MHz, but the cutoff frequency may be set at another frequency as would be obvious to one of ordinary skill in the art, based on examination of the spectral distribution of the Hazardous EMI signal to be blocked, where such knowledge of the signal is available.

In certain implementations the ionizable gas is hydrogen or argon, but many different gasses and gas mixtures can be successfully used, each yielding performance characteristics as would be obvious to a person of ordinary skill in the art.

In some cases, the hazardous EMI is: i) an electromagnetic pulse generated by a nuclear detonation (NEMP), ii) lightning, and iii) or a coronal mass ejection.

In some embodiments, the device further comprises a sealable gas inlet port coupled to the body of the waveguide housing through which ionizable gas is delivered into the waveguide. A means for measurement of the internal ionizing gas pressure is provided.

In an alternative embodiment, the present disclosure provides a crossover device for protecting an RF system from destructive effects of hazardous electromagnetic interference (EMI). The crossover device comprises an input port coupled to a first RF signal conductor exposed to receipt of incoming hazardous EMI, a high pass filter coupled to the input port and having a set cutoff frequency configured to block spectral components of incoming signals below the cutoff frequency containing a vast majority of a total energy of the incoming hazardous EMI received at the input port, and to pass spectral components of incoming signals above the cutoff frequency, a low pass filter coupled to the input port, the low pass filter configured to pass spectral components below the cutoff frequency to route said spectral components containing the vast majority of the incoming hazardous EMI to ground, and an output port coupled to the high pass filter and to a second RF signal conductor, the output passing spectral components of communicated RF signals above the cutoff frequency received from the high pass filter to the second RF signal conductor.

In certain implementations, the input port includes a coaxial-to-waveguide transition.

In all embodiments, the low pass filter output is coupled to ground via a conductive strap having a low impedance. In some implementations, the width of the strap is has a magnitude at least two time greater than its thickness.

In certain implementations, the low pass filter includes a Butterworth filter, but other filter topologies will work and may be desirable.

The crossover device preferably further comprises a circuit board having a contiguous equipotential ground plane, wherein the low pass filter and the high pass filter are coupled to the circuit board. The entire circuit is mounted in a shielded enclosure.

The present disclosure further provides a method of protecting an RF system from destructive effects of hazardous electromagnetic interference (EMI) that comprises separating incoming electromagnetic radiation including hazardous electromagnetic interference according to frequency into low frequency spectral components below a selectable cutoff frequency and high frequency spectral components above the selectable cutoff frequency, and routing the low frequency portion of spectral components which include a vast majority of energy contained in the hazardous electromagnetic interference to ground via a low impedance conductor.

In some embodiments, the method further comprises routing the high frequency spectral components of the hazardous EMI into an enclosure containing an ionizable gas, wherein high energy components of the hazardous EMI induces ionization of the ionization gas, which shunts most of the energy to ground through the walls of the waveguide, thus reducing remaining energy of the high frequency spectral component below a destructive level.

In some embodiments, the separating is performed using a waveguide through which the high frequency spectral components above the cutoff frequency pass. The waveguide is filled with the ionizable gas, and the selectable cutoff frequency is determined by transverse dimensions of the waveguide.

In some embodiments, the low frequency spectral components are routed to ground through a low impedance conductor in the form of a strap having a width and thickness, the width having a magnitude at least two times greater than a magnitude of the thickness.

In an alternative embodiment, the separation is performed using a low pass filter which is adapted to block the high frequency spectral components of the hazardous EMI above the cutoff frequency, and a high pass filter adapted to block the low frequency spectral components of the hazardous EMI below the cutoff frequency, the low pass filter having an output coupled to an external ground.

In certain implementations, the output of the low pass filter is coupled to external ground via a low impedance conductor in the form of a strap having a width and thickness, the width having a magnitude at least two times greater than a magnitude of the thickness.

These and other aspects, features, and advantages can be appreciated from the following description of certain embodiments of the invention and the accompanying drawing figures and claims.

DETAILED DESCRIPTION OF CERTAIN EMBODIMENTS OF THE DISCLOSURE

Disclosed herein is a method and device that suppresses hazardous EMI, such as electromagnetic pulses (EMP in its varying forms) produced by nuclear detonations, lightning, coronal mass injections, utilizing waveguide and/or coaxial crossover devices. While intended for use at frequencies of 1.5 GHz and higher, it is possible to build and operate systems as described herein to operate at lower frequencies, such as around 500 MHz, given appropriate adjustments to the device parameters or at higher frequencies should the need occur. In a first embodiment, the device comprises a waveguide that is specially adapted to separate out high energy electromagnetic pulse energy at frequencies below a cutoff frequency specific to the waveguide to ground, thereby protecting infrastructure equipment from potential damage. Within the waveguide an ionizable gas is maintained such that if the level of the electric field of the incoming hazardous EHI, such as SREMP, HEMP, coronal mass ejections, etc. exceeds a certain predetermined level, it ionizes the gas, causing said high-energy ions to be routed through the walls of the waveguide to a low-impedance path to ground. In this manner, any portion of the potentially destructive energy of the received hazardous EMI which is not blocked by the inherent high pass filter nature of a waveguide is prevented from causing damage to the infrastructure by being safely routed to ground.

Figure 5:
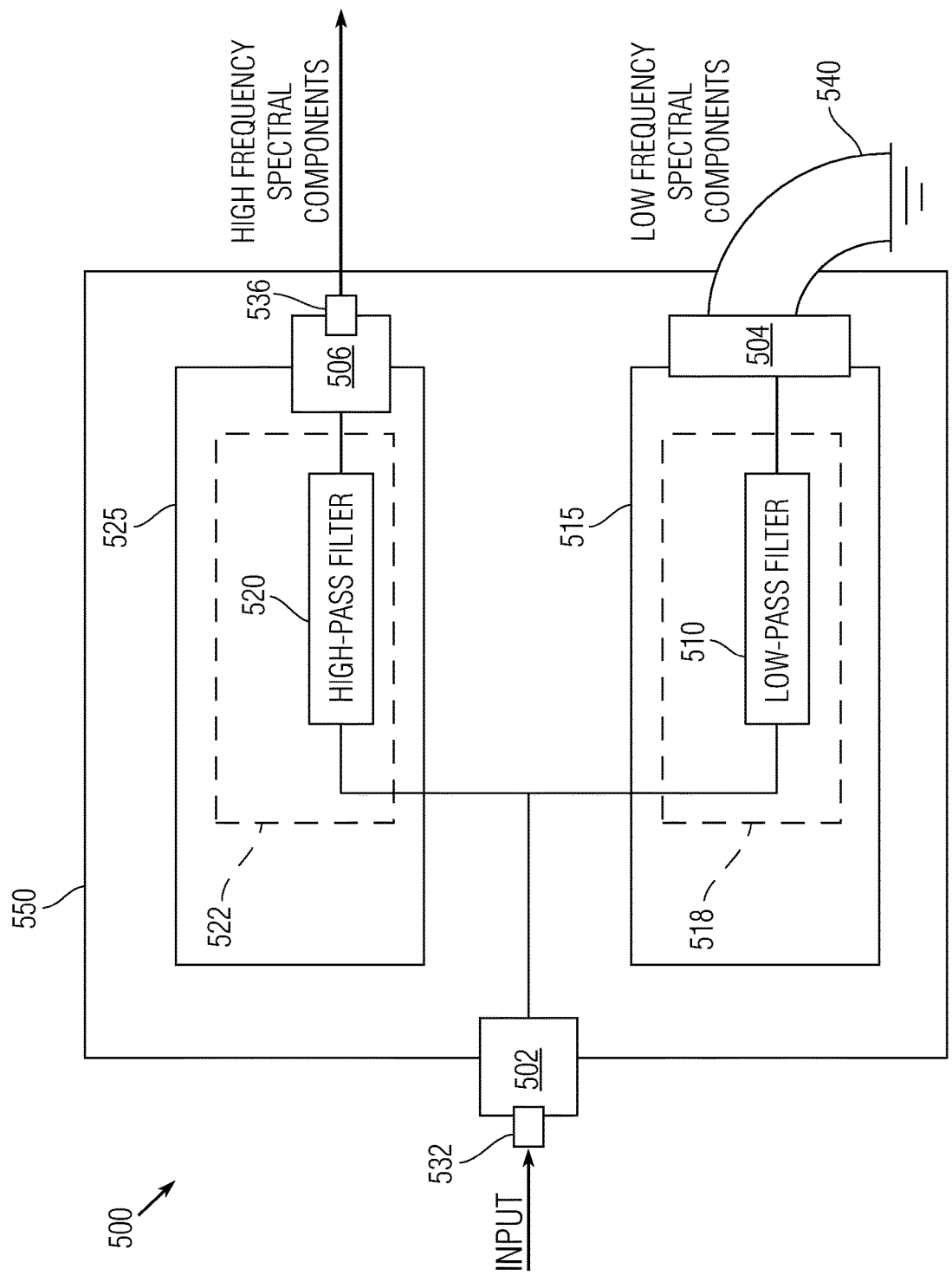
FIG. 5 shows a second embodiment of a crossover device according to the present disclosure.

In another embodiment, the device comprises a device having an input, a low frequency output and a high frequency output. Between the input and the low frequency output which is grounded is a low pass filter, and between the input and the high frequency output is a high frequency filter. The low and high pass filters are tuned to a crossover frequency that represents the region in the RF spectrum below which the bulk of the unwanted energy is contained, typically around 500 MHz. For example, using 500 MHz as an example crossover frequency, the spectral components of input signals below 500 MHz are channeled toward the low frequency output, while spectral components above 500 MHz are channeled toward the high frequency output. The device is built according to the design rules normally associated with electronics systems for operation at the exemplary frequency (as shown in FIG. 5). It is noted that the crossover frequency can be set to a higher value if it is deemed necessary for a particular application. It is emphasized that the 500 MHz cutoff frequency is exemplary and that other cutoff frequencies (and corresponding waveguide dimensions) can be used as suited to particular applications.

Figure 1A:
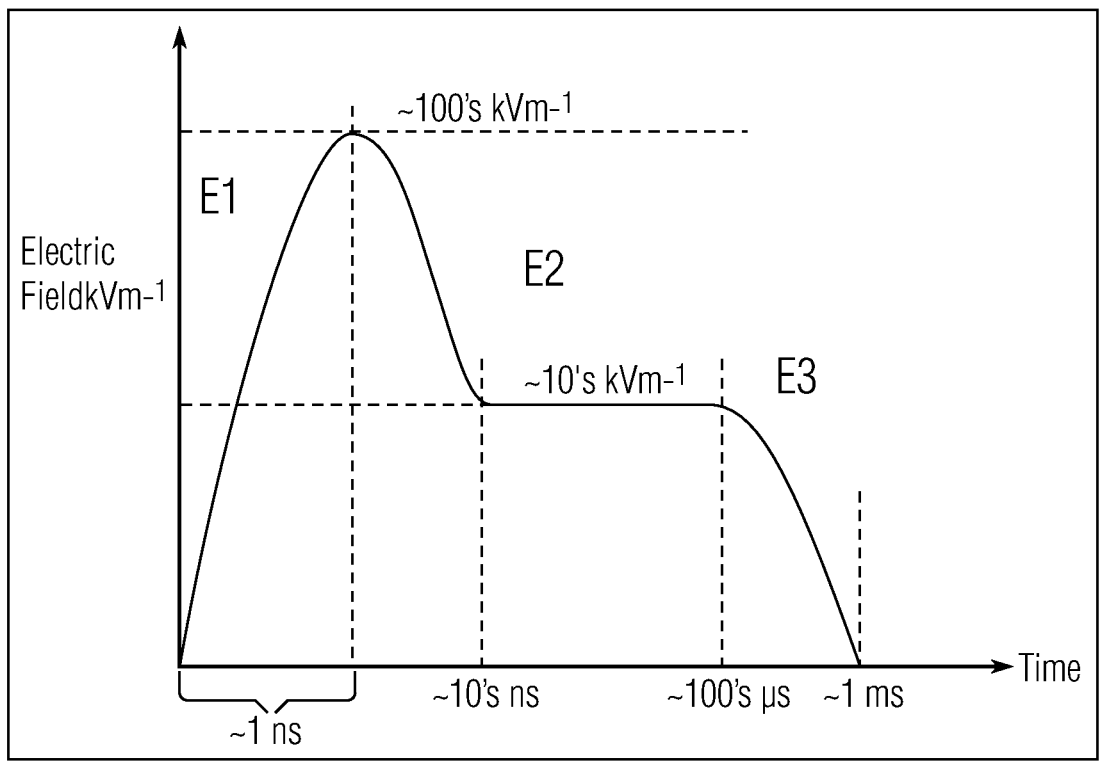
FIG. 1A is a graph of an EMI waveform generated by an exemplary endo-atmospheric detonation (SREMP) over time. (From Sandia National Laboratory, hereinafter "Sandia").
Figure 1B:
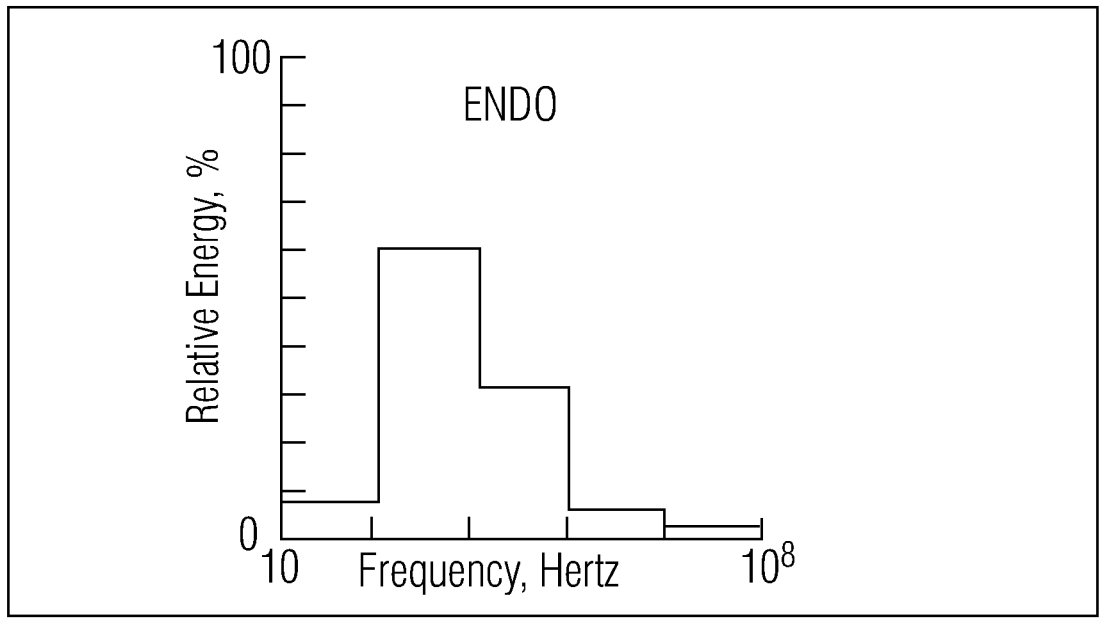
FIG. 1B is a graph of the relative energy of the SREMP waveform versus frequency. (From Sandia)
Figure 2A:
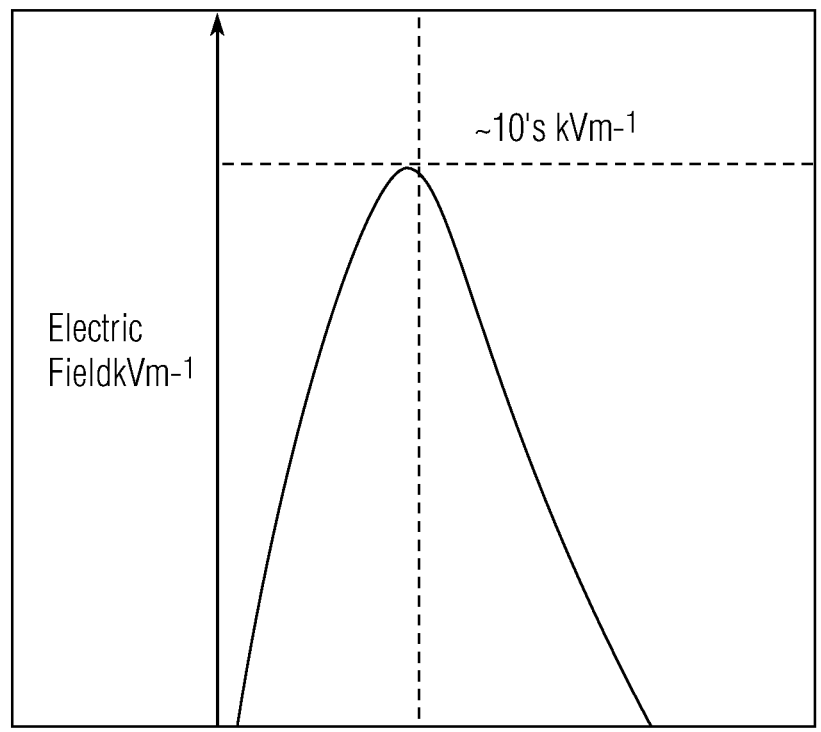
FIG. 2A is a graph of an EMI waveform generated by an exemplary exo-atmospheric (HEMP) detonation over time. (From Sandia)
Figure 2B:
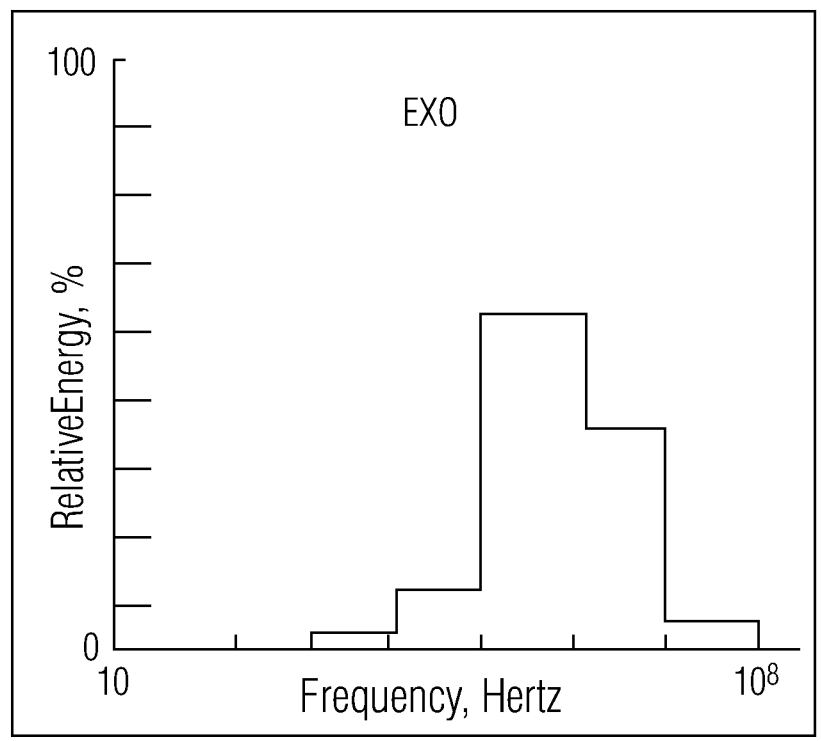
FIG. 2B a graph of the relative energy of the HEMP waveform versus frequency. (From Sandia)
Figure 3A:
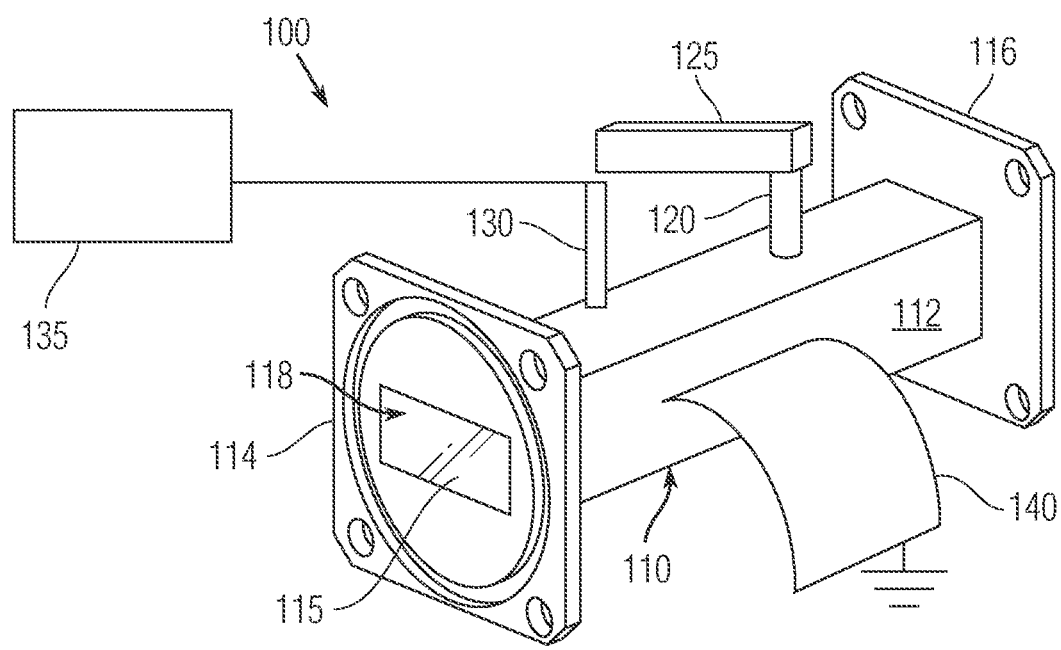
FIG. 3A shows a first embodiment of a device for protecting an RF system from the effect of hazardous EMI according to the present disclosure.

FIG. 3A shows a first embodiment of a device 100 that shows the preferred embodiment which is implemented using a waveguide. This embodiment is particularly suited for satellite, cellular, and microwave applications that operate at high power and high frequencies. The device includes a waveguide housing 110 that in the embodiment shown is rectangular in form. This is exemplary and the waveguide housing 110 can also be implemented in other ways, for example with a circular or elliptical cross-section or with bends and turns depending on the needs of the system in which the crossover device is utilized. Waveguides are well-known structures available from many manufacturers in a wide variety of forms. The waveguide housing 110 is a precisely-dimensioned pipe-like structure, which is manufactured to exact dimensions relative to the frequency band it is designed for. The waveguide housing includes a body 112, an input port 114 positioned at a first end of the body, a first RF-transparent pressure-sealed window 115 and an output port 116 positioned at the second end of the waveguide body with a second RF-transparent pressure-sealed window (not shown in FIG. 3A).

An internal waveguide 118 (bounded by the body 112 of the waveguide) extends from the input port 114 to the output port 116. The input and output ports can be coupled to other waveguides or to coaxial cables using standard transitional connectors (shown in FIG. 4). Waveguides are known to have natural cutoff frequencies as described by Maxwell's equations for supporting electromagnetic fields which are constrained by the conditions within the pipe. The waveguide Cutoff Equation, $f_c=c/2a$, in which c is the speed of light and a is the largest transverse internal dimension of the waveguide in meters, yields the lowest frequency that a given waveguide will support at the fundamental $TE_{10}$ transmission mode is. Accordingly, the waveguide 118 acts as a natural high-pass filter and prevents radiation below the cutoff frequency from propagating through the waveguide. Such undesired energy is shunted to ground by the external waveguide structure. In some implementations, the waveguide 118 can be constructed to have a cut-off frequency of approximately 500 MHz. This would require that the waveguide body 112 have a width of approximately 5 cm.

In some implementations, coupled to the body 112 is a gas supply port 120 through which an ionizable gas such as hydrogen, argon, or other gases or gas mixtures, can be supplied into the waveguide from a controllable gas supply 125. The gas supplied enters and fills the waveguide 118. Once the waveguide is filled, the gas supply port can be sealed. The ionizable gas within the waveguide is then maintained at the initial pressure of the gas supplied as it is complete sealed with respect to gas flow, with the pressure of the gas set to allow ionization when the internal electric field strength exceeds a predetermined value. The purpose of supplying ionizable gas into the waveguide is to provide a means through which the excess power of received hazardous EMI can be removed from the waveguide and the electrical system. A pressure monitoring means is provided to ensure that the gas pressure is correct to allow ionization at a predetermined field strength. Such monitoring may be local via a direct reading gauge or remote by an electronic connection to a remote readout or controller.

For example, the internal gas pressure is set to a level such that extremely high electric field strength of EMP pulses from any hazardous EMI that reach the waveguide (which can be on the order of 100 KV/Meter or higher) is sufficient to rapidly ionize the gas within the waveguide (in a time period of less than 10 nanoseconds) to create a plasma of charged particles and electrons. While a substantial portion of the spectral content below the cutoff frequency G is blocked by the waveguide itself, a sufficient quantity plus portions of the spectral content above G enter the waveguide but are undesirable. The ionizable gas at a critical pressure ensures that when this threshold is exceeded, the gas ionizes and shunts the excess energy to ground through the waveguide walls. The plasma shunts unwanted energy to ground via an external low impedance ground connection 140.

Figure 8:
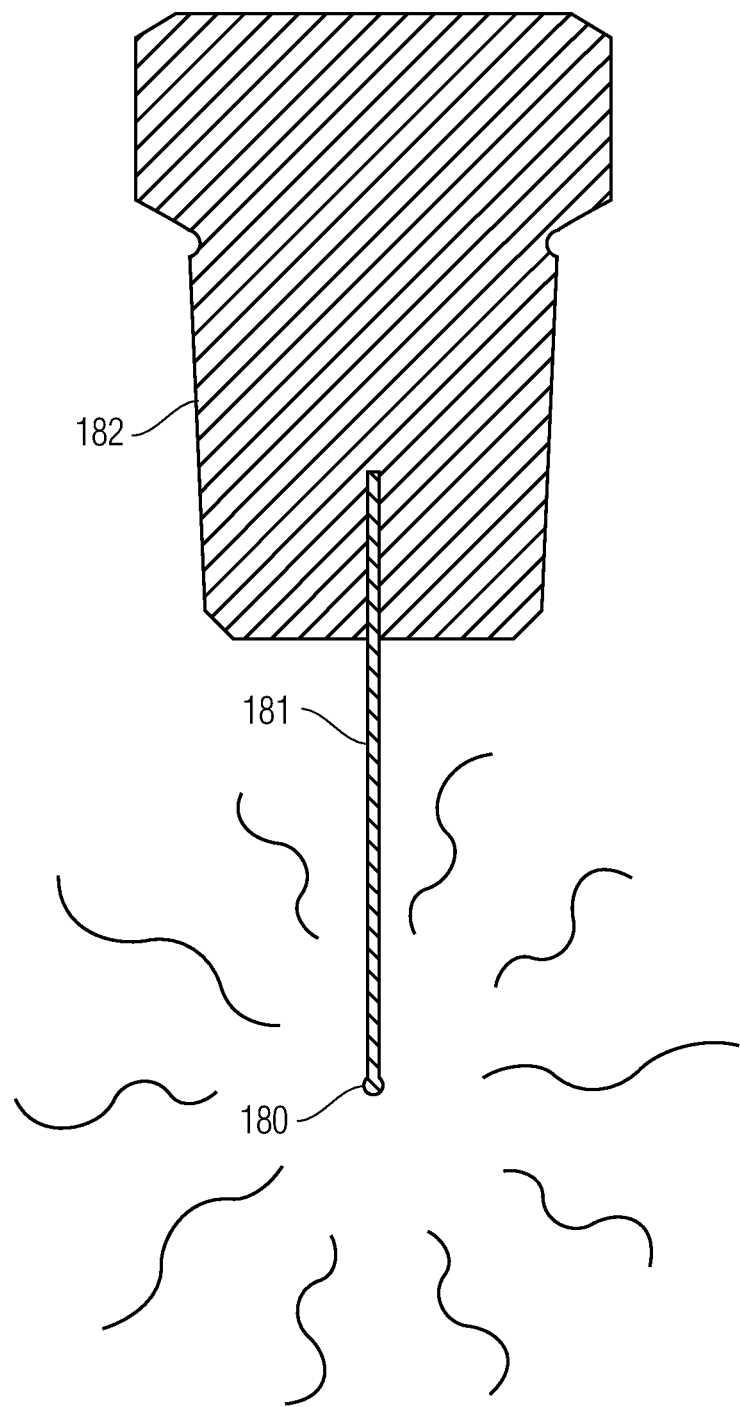
FIG. 8 is a cross-sectional view of an embodiment of a radioisotope source that can be used in the waveguide devices according to the present disclosure.

In order to ensure the fastest possible response time to an excess of energy in the waveguide, a small radioisotope source, such as a small piece of Lead$^{210}$, Strontium$^{90}$, Polonium$^{210}$, or Thallium$^{204}$ or other radioactive material, is provided. An embodiment of a radioisotope source 180 adapted for the waveguide device is shown in FIG. 8. As shown, the radioisotope source 180 is mounted on a small pin 181 that protrudes into the waveguide by a small amount. The pin can be coupled to the plug 182 by welding or in any other highly secure manner. The amount of radioactive material is sufficiently small that the walls of the waveguide provide the necessary shielding to prevent any health issues from occurring. The radioactive material is sealed inside the waveguide structure to prevent tampering. Other isotope sources may be used, so long as their half-life is sufficient to meet the required operational life of the device.

To monitor the plasma generated within the waveguide 118, a plasma probe 130 is coupled to the body 112 and extends into the waveguide. The plasma probe 130 is coupled to a detector 135 that is configured to detect the plasma concentration within the waveguide. Plasma probes of the Langmuir design are well known but other types of plasma probes or probe monitoring circuitry can be used.

Depending on the detected plasma concentration, the pressure of the gas supplied to the waveguide can be increased or decreased, and/or an inert gas can be introduced to reduce or limit plasma formation. The gas supply 125 can be controlled manually or automatically through an electronic controller coupled to be the gas supply 125 and the detector 135 or the present invention can be filled at the time of manufacture and sealed against leakage.

A wide conductive strap 140 which can be planar in form as shown provides a low-inductance, low-impedance path to ground for dissipating the energy contained in the plasma generated within the waveguide 118. The conductive strap 140 can be coupled to the body 112 of the waveguide, or alternatively, the conductive strap can be coupled to the input port 114 or output port 116. The conductive strap 140 can be implemented using a copper ribbon as one possible example. The relative dimensions of the conductive strap in term of length, width and thickness determine the inductance of the strap, which in turn determines the impedance of the strap to the plasma flow since the impedance (or reactance) of an inductor is proportional to its inductance. A conductor with a high inductance will fail to remove the charged particles within the waveguide quickly enough and will also be subject to electromagnetic reflections. The ratio between the width of the strap 140 (as measured longitudinally along the waveguide) to its thickness is an important factor in determine the inductance and impedance of the strap. Generally, the strap 140 is constructed so that its width (as measured longitudinally along the waveguide) is greater than twice the value of its thickness to ensure low inductance and impedance. See "Electromagnetic Compatibility Handbook" by Kenneth Kaiser, CRC Press 2005; 15.9. In some embodiments, the width of the strap 140 is greater than twice its thickness. In certain embodiments, the width of the strap is between 5 and 10 times its thickness, and in further embodiments, the width of the strap is greater than 10 times its thickness. It is noted that a round wire ground connection can be used although at the reduction of the efficiency of the ground connection performance.

In operation, if incoming hazardous EMI is received, frequencies below the cutoff frequency cannot propagate through the waveguide. As explained above, for many of the most hazardous types of EMI, such as EMP arising from nuclear detonations (SREMP, HEMP, and SGEMP) or from non-nuclear sources (NNEMP, IEMI, etc.), the vast majority of the energy is located in the low frequency spectral domain, below 500 MHz. Vast majority herein should be construed to mean at least 80 percent. Accordingly, upon entering the waveguide via a coupling means, the vast majority of the hazardous EMI is cutoff and does not propagate through the waveguide. The conductive strap 140 provides a path for this hazardous EMI to go to ground. As the impedance of the strap is low, the energy is routed to ground quickly and efficiently and with minimum reflections as would be the case with a higher impedance ground connection. The plasma can be monitored via the probe 130 and detector 135 to indicate the generation of a plasma when hazardous EMI is received.

Figure 3B:
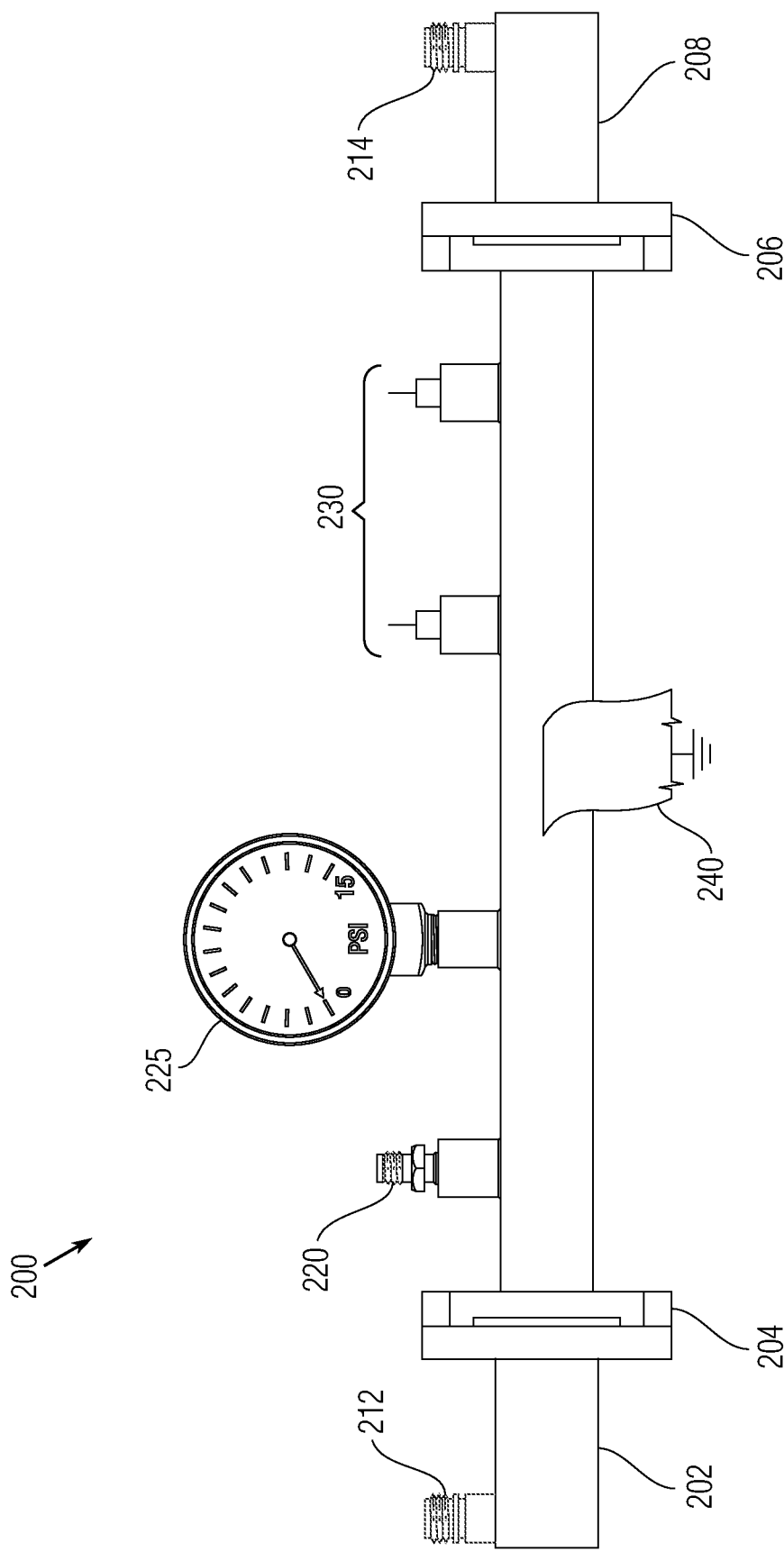
FIG. 3B shows another embodiment of a waveguide device for protecting an RF system from the effect of hazardous EMI according to the present disclosure incorporating coaxial to waveguide input and output transition devices.
Figure 4:
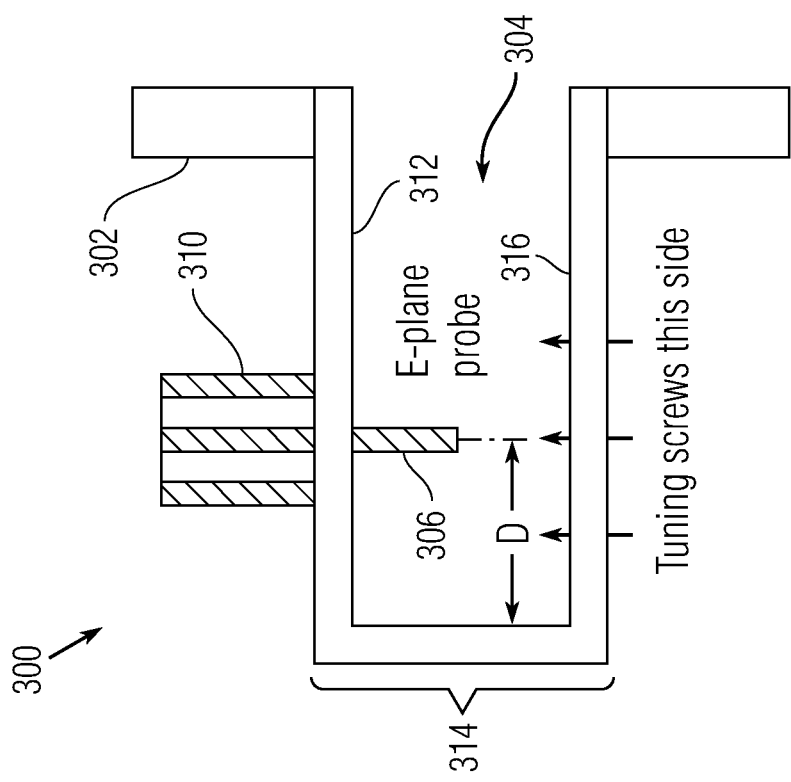
FIG. 4 shows an exemplary Type N coaxial connector to waveguide transition that is suitable for use in some embodiments of the protective device.

Waveguide to waveguide or coaxial-to-waveguide transitions can be used at either the input port 114, or output port 116 or both ports of the waveguide. As it is common practice to incorporate waveguide to coax transitions in many cellular, microwave, and satellite electronics systems, it is economical to incorporate such transitions in the input port 114 of the current invention, thus allowing for a more compact total system. FIG. 4 is a cross-sectional view of an exemplary Type N to waveguide transition that is suitable for use in some embodiments of the protective device. However, other RF transitions can be used. As shown in FIG. 4, the front end of the transition 300 includes a flange 302 surrounding a window 304 through which RF radiation enters the waveguide. A coaxial connector 310 is coupled to the top side 312 of the transition and is aligned with an e-plane probe 306. The coaxial connector 310 includes concentric conductors with dielectric material filled in between the conductors. The e-plane probe 306 extends downwardly from the top side 312 of the transition and is positioned horizontally at a selected distance (D) from the back end ("back-short") 314 of the transition. Tuning screws (not shown) can be inserted from the bottom side 316. It is noted that the position of the coaxial connector 310 is determined by the desired position of the e-plane probe 306 and can be located in other positions including the end plate of the transition in which case the coaxial connector leads out in line with the waveguide. It is noted that while type "N" coaxial connectors are referred to herein, other connector types can be used with this invention FIG. 3B is a side view of another embodiment of device for protecting RF systems from the effects of hazardous EMI using a waveguide. The device 200 comprises an elongate body 202 with flanges 204, 206 at either longitudinal end of the body. The body 202 encloses a waveguide (not shown in the figure) that extends longitudinally through the device. In some implementations it can be useful to increase the longitudinal length (z) of the waveguide as it provides a greater volume of ionizable gas for dissipating the energy of high frequency spectral components of hazardous EMI. The flanges are fitted with a RF transparent window that and is sealed with respect to gas flow so that the waveguide, between the flanges 204, 206, is gas tight, allowing the waveguide to be filled with ionizable gas. At a first longitudinal end (input) of the device 200 a first N-type transition 212 is located through which RF signals transmitted on a coaxial cable are input to the waveguide device 200. At a second end (output) of the device, a second N-type transition 214 is located through which RF signals transmitted through the waveguide are output to another coaxial cable. Both the first and second coax to waveguide transitions are optional and are included to suit the requirements of the installation.

Figure 3C:
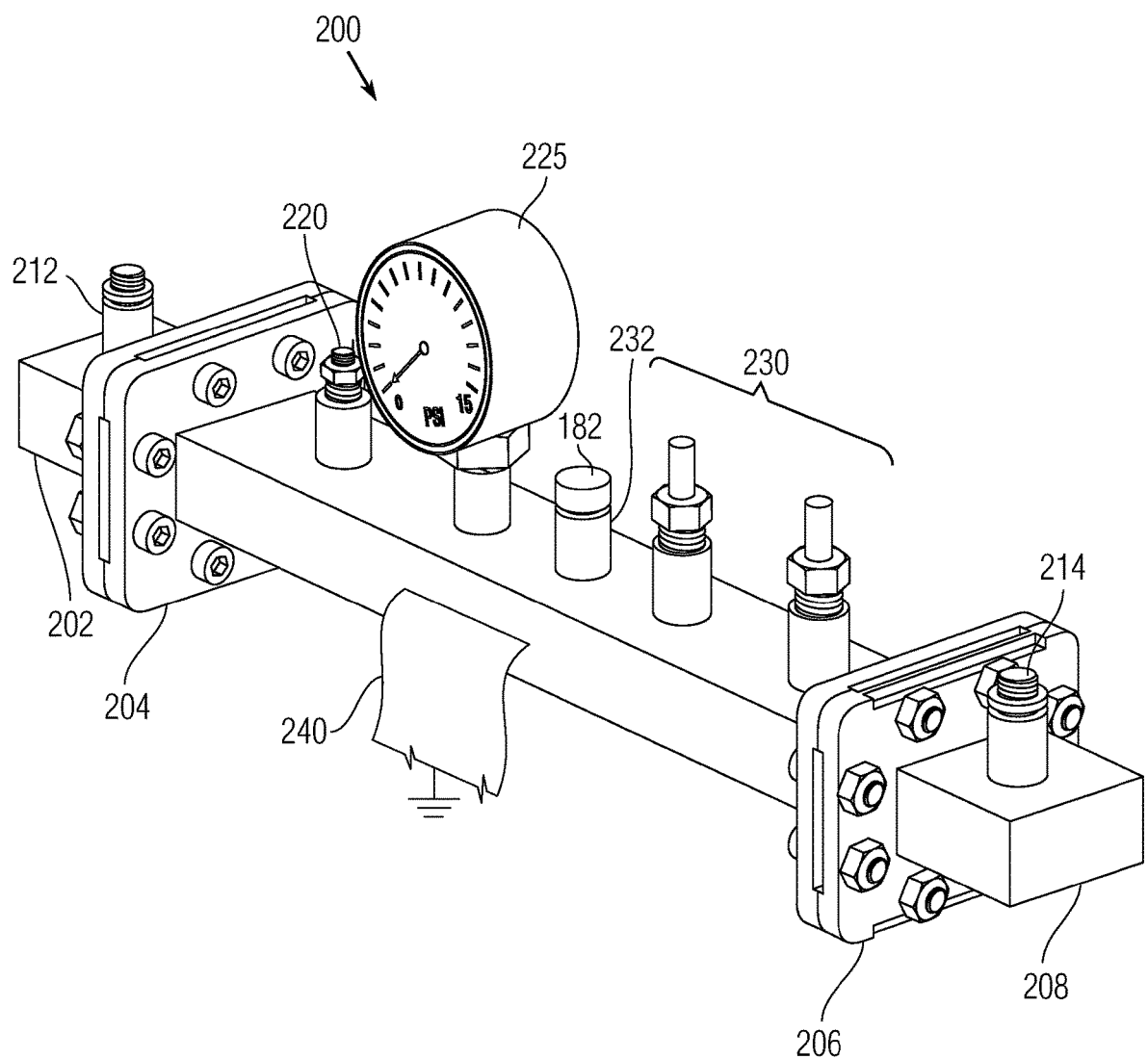
FIG. 3C shows a perspective view of an embodiment of a waveguide device according to the present disclosure having a radioisotope source.

In order to reduce the response time of the device, it is desirable to include a small radioisotope source located in the internal space of the waveguide to preionize the gas fill. Such as radioisotope source is very small and only produces a minimal amount of radiation, that being sufficient to preionize the gas. Any of several radioisotopes can be used, however consideration must be given for the degree of radiation fluence produced by said source. Radioisotopes such as a small piece of Lead$^{210}$, Strontium$^{90}$, Polonium$^{210}$, or Thallium$^{204}$ or other radioactive material are commonly used for this type of function and are considered safe in the small quantities involved. FIG. 3C is a perspective view of an embodiment of a waveguide, similar to the embodiment shown in FIG. 3B, that includes an additional port 232 through which a radioisotope source is inserted via a secure plug 182 (see FIG. 8).

A gas inlet port 220, which can be implemented using a Schrader valve (or other type of valve or seal) is coupled to waveguide body 202. The gas inlet port 220 can be coupled to a gas supply tank to fill the waveguide with ionizable gas. This can be done at an initial stage before installing the waveguide device 200 in the RF system. The gas inlet port can be sealed afterwards. A pressure gauge or sensor 225 is also coupled to waveguide section 204. While the waveguide of the device 200 is designed to be sealed and gastight, some gas can escape over time through the various couplings (e.g., 212, 214, 220) of the device. The pressure gauge 225, which measures the pressure of the gas in the waveguide, can indicate if the pressure reaches a lower threshold that is beneath the level required to provide sufficient ionization for the purposes described herein. If the pressure reaches the lower threshold, the device 200 can be taken offline, and additional ionizable gas can be supplied to the device either by removing the seal from the gas inlet port or substituting a new device.

To monitor the plasma generated within the waveguide 118 by hazardous EMI, a plasma probe 230 is also coupled to the waveguide body 202. There are multiple configurations of plasma probes that can be used, as well as multiple circuit topologies that can be used to read out the resulting data. Typically, probes are either single or double electrode configuration configurations. An electrode is typically a rod of Tungsten with a sharpened point, although other configurations including ball end probes may be successfully used. The readout circuitry can be as simple as a single capacitor of appropriate voltage and capacitance rating wired in series with a single probe to complex differential circuits used with double probe configurations. The choice of probe and circuit configurations is dependent on what the end user intends to do with the output. In the simplest configuration, a single probe is used with a series capacitor as a voltage divider. The output is sent to a threshold detector which determines if the probe output voltage is above or below some predetermined level, which in this case corresponds to a Hazardous EMI event. This output is used to notify the system operators that such an event has occurred so that other preventative measures, either manually or automatically initiated, can be applied.

A conductive strap 240 which can be planar in form as shown, is coupled to waveguide guide section 206. The conductive strap 240 provides a low-inductance, low-impedance path to ground for dissipating the energy both contained in the plasma generated in the waveguide, or energy blocked by the low pass aspect of the current invention. The conductive strap 240 can be coupled as shown to the body of one of the sections of the waveguide, or alternatively, the conductive strap can be coupled to the ends of the waveguide, conductive strap 240 can be implemented using a copper ribbon as one possible example. The relative dimensions of the conductive strap in term of length, width and thickness determine the inductance of the strap, which in turn determines the impedance of the strap to the plasma flow since the impedance (or reactance) of a conductor is proportional to its inductance. Generally, the strap 240 is constructed so that its width (as measured longitudinally along the waveguide) is greater than twice the value of its thickness to ensure low inductance and impedance. In some embodiments, the width of the strap 240 is greater than twice its thickness. In certain embodiments, the width of the strap is between 5 and 10 times its thickness, and in further embodiments, the width of the strap is greater than 10 times its thickness. It is noted that a round wire ground conductor can be used, but with reduced performance.

In another embodiment, the present invention provides a protective device that uses circuit components rather than waveguides to filter out low frequency components of incoming EMI. FIG. 5 is a schematic diagram of a general 3-port radiofrequency (RF) block "crossover device" according to teachings disclosed herein, and are of sufficient wattage capacity to handle the very large instantaneous peak power pulse associated with hazardous EMI events. The crossover device 500 includes an input port 502 which can be configured, for example, to receive RF signal input directly from an RF antenna. The input port 502 is coupled to the input of a low pass filter 510 which is enclosed in a first RF shielded housing 515. The low pass filter is positioned on a circuit board 518 within the housing 515, drawn in outline. The output of low pass filter 510 is fed to a ground connection pad 504, which is, in turn connected to RF ground, for example, via a low impedance conductive strap 540 such as discussed above, to minimize the impedance of the ground connection. The input port 502 is also connected to the input of a high pass filter 520 which is enclosed in a second RF shielded housing 525, separate and distinct from the first shielded housing. Having separate shielded housings 515, 525 prevents crosstalk between the filters. The high pass filter 520 is positioned on a circuit board 522 within the housing 525, drawn in outline. The output of high pass filter is coupled to an output port 506. The low and high pass filters 510, 520 are tuned to a crossover frequency that represents the region in the RF spectrum below which the bulk of the unwanted energy is routed to ground rather than dissipated as heat. For example, using 500 MHz as an example crossover frequency, the spectral components of input signals below 500 MHz are channeled toward the low frequency output 504 (ground connection pad), while spectral components above 500 MHz are channeled toward the high frequency output 506. The device is built according to the design rules normally associated with electronics systems for operations at the exemplary frequency.

The circuit boards 518, 522 are designed according to design rules specific to RF circuits (as opposed to digital circuits operating at comparable frequencies). The RF designs rules include details such as a contiguous equipotential ground plane on the underside of the board, appropriately shaped conductor paths with associated ground structures arranged to form transmission lines in structures such as microstrip, suspended microstrip, coplanar, or other well-known microwave transmission line structures. It is noted that audio crossover network physical topologies do not use microwave circuit design techniques and as such would not work in accordance with the current invention In some embodiments, all of the aforementioned components of the crossover device 500 are mounted in an additional heavily radio-frequency shielded housing 550. Mounted on the housing 550 are a first RF connector 532 leading to the input port 502 and a second RF connector 536 leading from the second output port 506. Additionally, a large, low impedance ground connection pad 534 is mounted on the housing for connecting the output of the low pass filter 510 and circuit assembly 518 to RF ground via a low impedance conductive strap 540. The low pass filter 510 is designed to block a vast majority of the spectral components of the input signal above a selected frequency term the "cutoff" frequency (Fe) and to pass the vast majority of spectral components below the cutoff frequency. Conversely, the high pass filter 520 is designed to block a vast majority of the spectral components of the input signal below Fe, and to pass the vast majority of the spectral components above $F_c$. In this manner the crossover device channels the spectral components of the input signal that are below $F_c$ to the first output port 504 and channels the spectral components of the input signal that are above $F_c$ to the second output 506. In the embodiment shown in FIG. 5, the components $>F_c$ are output via RF connector 534, while the components $<F_c$ are diverted to RF ground.

As noted above, the vast majority of energy of hazardous EMI of interest is in the low frequency domain, as shown in FIGS. 1A, 1B, 2A and 2B. Accordingly, the energy below the cutoff frequency (Fe), being blocked by the high pass filter 520, is routed through the low pass filter 510 to ground through the low-impedance ground strap coupling.

Figure 6A:
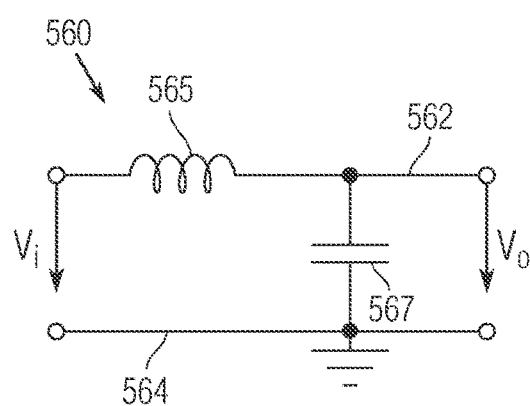
FIGS. 6A and 6B show embodiments of low pass filters that can be implemented in the second embodiment of the crossover device of the present disclosure.
Figure 6B:
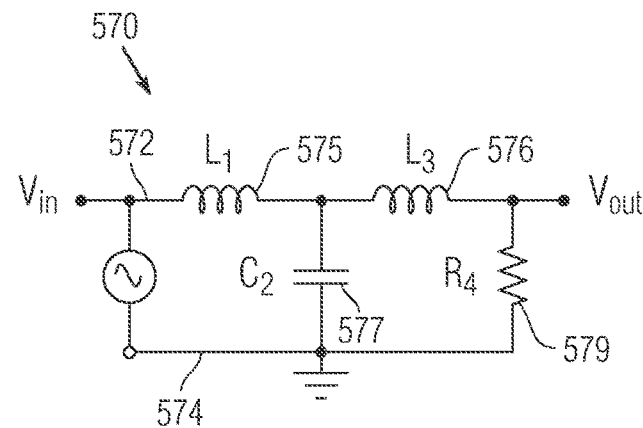

The low pass filter 510 can be embodied in different configurations. One example embodiment of a low pass filter 560 is shown in FIG. 6A. As shown an input voltage (Vi) across is applied across conductive lines 562, 564. A series inductor 565 is placed along conductive line 562 and a capacitor 567 is placed across conductive lines 562, 564 in a shunt configuration. The values of the inductor and capacitor are selected based so as to block a vast majority of spectral components above the cutoff frequency (e.g., 500 MHz). Since the reactance of an inductor is proportional to the frequency ($X_L=2\pi/L$) of the input signal while the impedance of a capacitor is inversely proportional to the frequency of the input signal ($Xc=1/2\pi/C$), at low frequencies most of the voltage drop occurs over the capacitor and the output voltage contains most of the magnitude of the input signal. In this manner, the configuration of FIG. 6A can be said to pass low frequency components and act as a low pass filter. High frequencies are absorbed by the inductor 565 and therefore are largely attenuated at the output. The two-pole Butterworth filter shown in FIG. 6B can also be used as a low-pass filter. The Butterworth filter 570 is formed of two series inductors 575, 576, and a capacitor 577 and resistor 579 positioned across conductive lines 572, 574. It is to be appreciated that a person of ordinary skill will recognize other useful low pass filter configurations having inductors (and/or resistors) in series and capacitors (and resistors) in shunt. In whichever configuration is used, the low-pass filter of the crossover device is designed to route the vast majority of the energy below $F_c$ of any received hazardous EMI to ground.

Figure 7A:
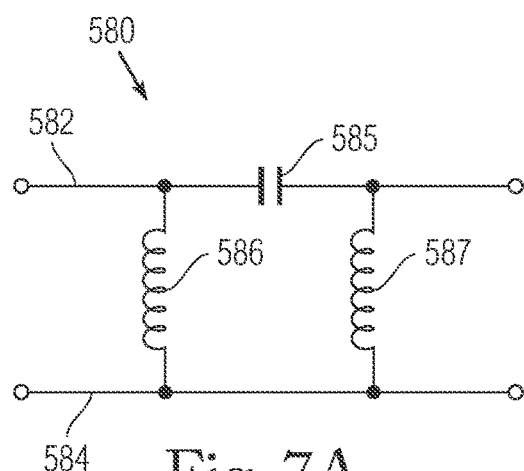
FIGS. 7A and 7B show embodiments of high pass filters that can be implemented in the second embodiment of the crossover device of the present disclosure.
Figure 7B:
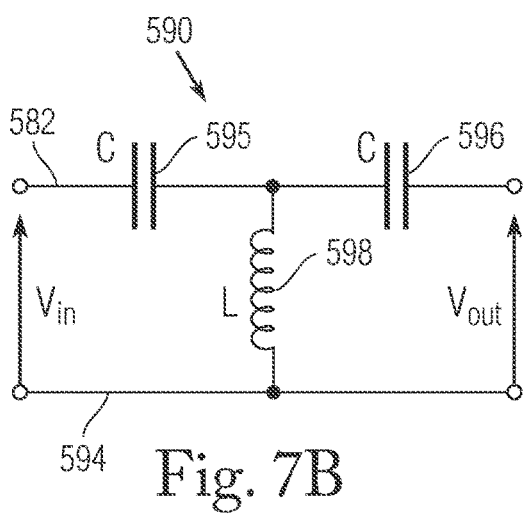

The high pass filter 580 is composed of similar components as the low pass filter but in opposite configurations. As shown in FIG. 7A, an embodiment of a high pass filter 580 across conductive lines 582, 584 includes a series capacitor 585 placed along conductive line 584 and two inductors 586, 587 placed across conductive lines 582, 584 in parallel, in a shunt configuration. The values of the inductor and capacitor are selected so as to block a vast majority of the spectral components below the desired cutoff frequency (e.g., 500 MHz). FIG. 7B shows another embodiment of a high pass filter 590 having two capacitors in series 595, 596 along a conductive line 592 and an inductor 598 configured in shunt between conductive lines 592, 594. In the high pass filter the capacitor(s) along the conductive line present little resistance to high frequency components; instead, the voltage drop at high frequencies across the inductor in shunt across the conductive lines. Accordingly, the output signal includes a vast majority of the high frequency components of the input signal, which will generally include RF communication signals above the cutoff frequency, R. It is to be appreciated that a person of ordinary skill will recognize other useful high pass filter configurations having conductors (or resistors) in series and inductors in shunt.

The embodiments of the present disclosure fulfills a need long felt by those skilled and knowledgeable with respect to hazardous EMI, and who are aware of the vulnerabilities of conventional RF systems to hazardous EMI, whether natural or man-made. There is currently no commonly-deployed device is suitable for protecting RF equipment and systems from hazardous EMI and that is itself not susceptible to damage when certain types of hazardous EMI is received. Given the current mandate to improve the security of the nation's electrical and telecommunications infrastructure, the embodiments of present disclosure provide a needed solution that can be conveniently deployed.

It is to be understood that any structural and functional details disclosed herein are not to be interpreted as limiting the systems and methods, but rather are provided as a representative embodiment and/or arrangement for teaching one skilled in the art one or more ways to implement the methods.

It is to be further understood that like numerals in the drawings represent like elements through the several figures, and that not all components or steps described and illustrated with reference to the figures are required for all embodiments or arrangements.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and "comprising", when used in this specification, specify the presence of stated features, integers, steps, operations, elements, or components, but do not preclude the presence or addition of one or more other features, integers, steps, operations, elements, components, or groups thereof.

Terms of orientation are used herein merely for purposes of convention and referencing, and are not to be construed as limiting. However, it is recognized these terms could be used with reference to a viewer. Accordingly, no limitations are implied or to be inferred.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The subject matter described above is provided by way of illustration only and should not be construed as limiting. Various modifications and changes can be made to the subject matter described herein without following the example embodiments and applications illustrated and described, and without departing from the true spirit and scope of the invention encompassed by the present disclosure, which is defined by the set of recitations in the following claims and by structures and functions or steps which are equivalent to these recitations.

What is claimed is:

1. A method of protecting an RF system from destructive effects of hazardous electromagnetic interference (EMI) comprising:
   separating incoming electromagnetic radiation including hazardous electromagnetic interference according to frequency into low frequency spectral components below a selectable cutoff frequency and high frequency spectral components above the selectable cutoff frequency;
   routing the low frequency portion of spectral components which include a vast majority of energy contained in the hazardous electromagnetic interference to ground via a low impedance conductor; and
   routing the high frequency spectral components of the hazardous EMI into an enclosure containing an ionizable gas, wherein high energy components of the hazardous EMI induces ionization of the ionization gas, reducing remaining energy of the high frequency spectral component below a destructive level, and
   wherein the separating is performed using a waveguide through which the high frequency spectral components above the cutoff frequency pass, the waveguide being filled with the ionizable gas, the selectable cutoff frequency being determined by transverse dimensions of the waveguide.

2. The method of protecting an RF system from destructive effects of hazardous electromagnetic interference (EMI) comprising:
   separating incoming electromagnetic radiation including hazardous electromagnetic interference according to frequency into low frequency spectral components below a selectable cutoff frequency and high frequency spectral components above the selectable cutoff frequency;
   routing the low frequency portion of spectral components which include a vast majority of energy contained in the hazardous electromagnetic interference to ground via a low impedance conductor; and
   routing the high frequency spectral components of the hazardous EMI into an enclosure containing an ionizable gas, wherein high energy components of the hazardous EMI induces ionization of the ionization gas, reducing remaining energy of the high frequency spectral component below a destructive level, and
   wherein the low frequency spectral components are routed to ground through a low impedance conductor in the form of a strap having a width and thickness, the width having a magnitude at least two times greater than a magnitude of the thickness.

3. A method of protecting an RF system from destructive effects of hazardous electromagnetic interference (EMI) comprising:
   separating incoming electromagnetic radiation including hazardous electromagnetic interference according to frequency into low frequency spectral components below a selectable cutoff frequency and high frequency spectral components above the selectable cutoff frequency; and
   routing the low frequency portion of spectral components which include a vast majority of energy contained in the hazardous electromagnetic interference to ground via a low impedance conductor;
   wherein the separating is performed using a low pass filter which adapted the high frequency spectral components of the hazardous EMI above the cutoff frequency, and a high pass filter adapted to blocks the low frequency spectral components of the hazardous EMI below the cutoff frequency, the low pass filter having an output coupled to an external ground; and
   wherein output of the low pass filter is coupled to external ground via a low impedance conductor in the form of a strap having a width and thickness, the width having a magnitude at least two times greater than a magnitude of the thickness.

4. A device for protecting an RF system from destructive effects of hazardous electromagnetic interference (EMI), the device comprising:
   a waveguide having an input port and an output port, each of the input and output ports having an RF transparent window, the waveguide having an intrinsic cutoff frequency and being filled with an ionizable gas; and
   a low-impedance conductor having a first end coupled to the waveguide and a second end coupled to an external ground;
   wherein the waveguide is constructed to block spectral components of incoming hazardous EMI below the cutoff frequency and said spectral components below the cutoff frequency are routed to ground via the low-impedance conductor, and
   wherein spectral components above the cutoff frequency having high energy induce ionization of the ionizable gas in the waveguide.

5. The device of claim 4, wherein the low impedance conductor includes a copper strap having a longitudinal width and a thickness, the longitudinal width having a magnitude at least two times greater than a magnitude of the thickness.

6. The device of claim 4, further comprising:
   a plasma probe coupled to the waveguide; and
   a detector coupled to the plasma probe configured to measure a level of ionization within the waveguide.

7. The device of claim 4, wherein the cutoff frequency of the waveguide is approximately 500 MHz.

8. The device of claim 4, wherein the ionizable gas is hydrogen or argon or a mixture thereof.

9. The device of claim 4, wherein the ionizable gas is a gas other than hydrogen or argon.

10. The device of claim 4, wherein the hazardous EMI is one of: i) an electromagnetic pulse generated by a nuclear detonation (NEMP), ii) lightning, and iii) a coronal mass ejection.

11. The device of claim 4, further comprising a sealable gas inlet port through which ionizable gas is delivered into the waveguide.

12. The device of claim 4 further comprising a radioisotope source positioned in the waveguide, the radioisotope source having a flux intensity sufficient to preionize the ionizable gas within the waveguide, decreasing an ionization response time to an incoming signal above a designated threshold.

13. A crossover device for protecting an RF system from destructive effects of hazardous electromagnetic interference (EMI), the crossover device comprising:
   an input port coupled to a first RF signal conductor exposed to receipt of incoming hazardous EMI;
   a high pass filter coupled to the input port and having a set cutoff frequency configured to block spectral components of incoming signals below the cutoff frequency containing a vast majority of a total energy of the incoming hazardous EMI received at the input port, and to pass spectral components of incoming signals above the cutoff frequency;

a low pass filter coupled to the input port and to ground, the low pass filter configured to pass spectral components below the cutoff frequency and to route said spectral components containing the vast majority of the incoming hazardous EMI to ground; and an output port coupled to the high pass filter and to a second RF signal conductor, the output passing spectral components of communicated RF signals above the cutoff frequency received from the high pass filter to the second RF signal conductor;

wherein the low pass filter is coupled to ground via a conductive strap having a low impedance; and wherein the strap has a width and a thickness, the width having a magnitude at least two times greater than a magnitude of the thickness.

\* \* \* \* \*